(12) United States Patent
Guo

(10) Patent No.: US 11,735,333 B2
(45) Date of Patent: Aug. 22, 2023

(54) MANUFACTURING METHOD OF ANISOTROPIC CONDUCTIVE FILM AND APPARATUS THEREOF

(71) Applicant: Wuhan China Star Optoelectronics Semiconductor Display Technology Co., Ltd., Hubei (CN)

(72) Inventor: Zihao Guo, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 910 days.

(21) Appl. No.: 16/499,641

(22) PCT Filed: Apr. 11, 2019

(86) PCT No.: PCT/CN2019/082163
§ 371 (c)(1),
(2) Date: Sep. 30, 2019

(87) PCT Pub. No.: WO2020/118983
PCT Pub. Date: Jun. 18, 2020

(65) Prior Publication Data
US 2021/0327607 A1 Oct. 21, 2021

(30) Foreign Application Priority Data
Dec. 12, 2018 (CN) .......................... 201811520080.8

(51) Int. Cl.
*H01B 5/16* (2006.01)
*H01B 13/00* (2006.01)
(Continued)

(52) U.S. Cl.
CPC ................ *H01B 5/16* (2013.01); *B05D 3/20* (2013.01); *B05D 5/12* (2013.01); *H01B 13/0016* (2013.01);
(Continued)

(58) Field of Classification Search
CPC . H01R 11/01; H01R 3/00; H01R 4/00; H01R 13/00; H01R 43/00; H05K 3/32;
(Continued)

(56) References Cited

U.S. PATENT DOCUMENTS 6,020,059 A 2/2000 Yamada et al.

FOREIGN PATENT DOCUMENTS

CA 2795250 * 10/2011
CN 105845204 A 8/2016
(Continued)

*Primary Examiner* — Tabassom Tadayyon Eslami
(74) *Attorney, Agent, or Firm* — Taft Stettinius & Hollister LLP

(57) ABSTRACT

A manufacturing method of an anisotropic conductive film and an apparatus thereof are provided. The manufacturing method of an anisotropic conductive film includes steps of: (a) providing a first substrate having metal contacts; (b) disposing a resin layer on the first substrate and covering the metal contacts; (c) providing a press head having a suction pattern arranged corresponding to the metal contacts; (d) sucking the conductive particles by the press head; and (e) pressing the conductive particles into the resin layer by the press head. The conductive particles are disposed corresponding to the metal contacts of the substrate, so that the problem about the short circuit between contacts can be improved, and the product yield and reliability can also be improved.

10 Claims, 5 Drawing Sheets

(51) Int. Cl.
*B05D 3/00* (2006.01)
*B05D 5/12* (2006.01)

(52) U.S. Cl.
CPC ..... *H01B 13/0026* (2013.01); *H01B 13/0036* (2013.01)

(58) Field of Classification Search
CPC .. H05K 2203/105; H05K 3/0032; B05D 3/20; B05D 5/12
See application file for complete search history.

(56) References Cited

FOREIGN PATENT DOCUMENTS

| | | | |
|---|---|---|---|
| CN | 105974695 A | | 9/2016 |
| EP | 1686655 | * | 5/2006 |
| JP | 3900732 | * | 4/2007 |

* cited by examiner

MANUFACTURING METHOD OF ANISOTROPIC CONDUCTIVE FILM AND APPARATUS THEREOF

CROSS-REFERENCE TO RELATED APPLICATIONS

This application is a U.S. National Phase of International PCT Application No. PCT/CN2019/082163 filed Apr. 11, 2019, which claims the benefit of Chinese Patent Application Serial No. 201811520080.8 filed Dec. 12, 2018, the contents of each application are incorporated herein by reference in their entirety.

FIELD OF INVENTION

The present invention relates to an anisotropic conductive film manufacturing method and apparatus thereof, and more particularly to an anisotropic conductive film manufacturing method and apparatus thereof for a display.

BACKGROUND OF INVENTION

In recent years, with the rapid development of electronic products toward being light weight and compact, the demand for display panels used in various portable electronic products is increasing. In order to electrically connect a semiconductor element such as a driving circuit and a controller chip to a display panel, the element is usually placed on a substrate, and electrically connected to a glass substrate of the display panel via an anisotropic conductive film (ACF). The anisotropic conductive film is characterized in that Z-axis electrical conduction direction and the resistance characteristic of the XY insulating plane have significant differences. When the difference between the Z-axis on-resistance value and the XY plane insulation resistance value exceeds a certain ratio, the conductive particles are used to connect the electrode between the flexible substrate and the glass substrate provided with the integrated circuit chip to make it conductive, and at the same time avoid A short circuit is conducted between adjacent electrodes to achieve conduction only in the Z-axis direction.

Technical Problem

The anisotropic conductive film is usually composed of an adhesive layer and a plurality of conductive particles distributed in the adhesive layer. When the flexible substrate and the glass substrate are electrically conducted through the contacts of the upper and lower substrates via pressing an anisotropic conductive film during the bonding process via, the conductive particles may be moved under the pressing action, results that two adjacent contacts form a short circuit.

Therefore, it is necessary to provide a manufacturing method of an anisotropic conductive film and an apparatus thereof to solve the problems existing in the conventional art.

SUMMARY OF INVENTION

In view of above, the invention provides an anisotropic conductive film manufacturing method and an apparatus thereof, which solve the problem that two adjacent contacts form a short circuit existing in the conventional art.

A primary object of the present invention is to provide a manufacturing method of an anisotropic conductive film and an apparatus thereof, which can improve the problem that two adjacent contacts form a short circuit.

A secondary object of the present invention is to provide a manufacturing method of an anisotropic conductive film and an apparatus thereof, the conductive particles are disposed corresponding to the metal contacts of the substrate, so that the problem about the short circuit between contacts can be improved, and the product yield and reliability can also be improved.

In order to achieve the foregoing object of the present invention, an embodiment of the present invention provides a manufacturing method of an anisotropic conductive film, including steps of:
(a) providing a first substrate having a plurality of metal contacts;
(b) disposing a resin layer on the first substrate and covering the plurality of metal contacts;
(c) providing a magnetic pressing head having a suction pattern arranged corresponding to the plurality of metal contacts, wherein the magnetic pressing head has a plurality of controllable magnetic coils arranged corresponding to the suction pattern;
(d) sucking a plurality of conductive particles by the pressing head; and
(e) aligning the pressing head with the plurality of metal contacts, and pressing the plurality of conductive particles into the resin layer by the pressing head.

In an embodiment of the present invention, a first pitch of the plurality of metal contacts is equal to a second pitch of the plurality of controllable magnetic coils.

In an embodiment of the present invention, the step (e) further includes: heating the resin layer by the pressing head to melt the resin layer, thereby embedding the plurality of conductive particles into the resin layer and corresponding to positions of the plurality of metal contacts.

In an embodiment of the present invention, after the step of embedding the plurality of conductive particles into the resin layer, further including steps of: cooling the pressing head to cure the resin layer; and moving the pressing head away from the resin layer.

In an embodiment of the present invention, the manufacturing method of the anisotropic conductive film further includes steps of: providing a second substrate on the resin layer, and applying a pressure to the second substrate, thereby electrically connecting the second substrate to the plurality of metal contacts of the first substrate through the plurality of conductive particles.

Moreover, another embodiment of the present invention provides an anisotropic conductive film manufacturing method, including steps of:
(a) providing a first substrate having a plurality of metal contacts;
(b) disposing a resin layer on the first substrate and covering the plurality of metal contacts;
(c) providing a pressing head having a suction pattern arranged corresponding to the plurality of metal contacts;
(d) sucking a plurality of conductive particles by the pressing head; and
(e) pressing the plurality of conductive particles into the resin layer by the pressing head.

In an embodiment of the present invention, the pressing head is a magnetic pressing head having a plurality of controllable magnetic coils, the plurality of controllable magnetic coils are arranged corresponding to the suction pattern, and a first pitch of the plurality of metal contacts is equal to a second pitch of the plurality of controllable magnetic coils.

In an embodiment of the present invention, the step (e) further includes: aligning the pressing head with the plurality of metal contacts; and heating the resin layer by the pressing head to melt the resin layer, thereby embedding the plurality of conductive particles into the resin layer and corresponding to positions of the plurality of metal contacts.

In an embodiment of the present invention, after the step of embedding the plurality of conductive particles into the resin layer, further including steps of: cooling the pressing head to cure the resin layer; and moving the pressing head away from the resin layer.

In an embodiment of the present invention, the manufacturing method of the anisotropic conductive film further includes steps of: providing a second substrate on the resin layer, and applying a pressure to the second substrate, thereby electrically connecting the second substrate to the plurality of metal contacts of the first substrate through the plurality of conductive particles.

Furthermore, another embodiment of the present invention further provides an apparatus for manufacturing an anisotropic conductive film, including: a first substrate feeding zone configured to provide a first substrate, wherein the first substrate has a plurality of metal contacts, and the first substrate further has a resin layer disposed on the first substrate and covering the plurality of metal contacts; a conductive particle feeding zone configured to provide a plurality of conductive particles; a pressing zone, wherein the first substrate is transferred from the first substrate feeding zone to the pressing zone; and a pressing head having a suction pattern arranged corresponding to the plurality of metal contacts, wherein the pressing head sucks the plurality of conductive particles from the conductive particle feeding zone; and the pressing head is moved to the pressing zone to press the plurality of conductive particles into the resin layer.

In an embodiment of the present invention, the pressing head is a magnetic pressing head having a plurality of controllable magnetic coils, the plurality of controllable magnetic coils are arranged corresponding to the suction pattern, and a first pitch of the plurality of metal contacts is equal to a second pitch of the plurality of controllable magnetic coils.

In an embodiment of the present invention, the anisotropic conductive film manufacturing apparatus further includes: an alignment device configured to align the pressing head and the plurality of metal contacts; and a heating device configured to heat the resin layer by the pressing head to melt the resin layer, thereby embedding the plurality of conductive particles into the resin layer and corresponding to positions of the plurality of metal contacts.

In an embodiment of the present invention, the anisotropic conductive film manufacturing apparatus further includes: a control device connected to the heating device; and a temperature measuring device configured to measure a temperature of the pressing head, so that when the heating device heats the pressing head to a first temperature, the heating device is stopped to heat via the control device, and after the pressing head is stopped to heat and cooled to a second temperature measuring by the temperature measuring device, the pressing head is moved away from the resin layer.

In an embodiment of the present invention, the anisotropic conductive film manufacturing apparatus further includes: a resin dispensing device configured to dispense the resin layer on the first substrate by the resin dispensing device when the first substrate is provided at the pressing zone; and a pre-curing device configured to pre-cure the resin layer.

Beneficial Effect

Compared with the conventional art, the manufacturing method of the anisotropic conductive film and the apparatus thereof according to the present invention, it not only improves that the conductive particles disposes corresponding to the contacts on the substrate, thereby distributing the conductive particles at the locations of the contacts, so that the problem about the short circuit between contacts can be improved, and the product yield and reliability can also be improved.

DRAWINGS

In order to make the above description of the present invention more comprehensible, the preferred embodiments are described below, and in conjunction with the accompanying drawings, the detailed description is as follows.

DETAILED DESCRIPTION OF EMBODIMENTS

Figure 1A:
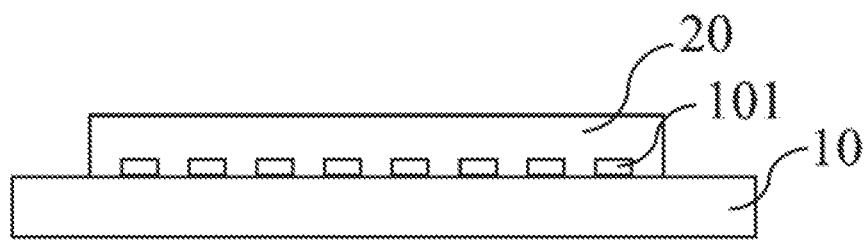
FIGS. 1A to 1H are schematic views showing a manufacturing method of an anisotropic conductive film and an apparatus thereof according to an embodiment of the present invention.

The following description of the various embodiments is provided to illustrate the specific embodiments of the invention. Furthermore, the directional terms mentioned in the present invention, such as upper, lower, top, bottom, front, rear, left, right, inner, outer, side, surrounding, central, lateral, horizontal, vertical, longitudinal, axial, radial, uppermost or lowermost, etc., only refer to the direction of the additional schema. Therefore, the directional terminology used herein is for the purpose of illustration and understanding of the invention.

Referring to FIGS. 1A to 1H, an embodiment of the present invention provides a manufacturing method of an anisotropic conductive film. The manufacturing method of the anisotropic conductive film further includes steps of:

(a) providing a first substrate 10 having metal contacts 101;

(b) disposing a resin layer 20 on the first substrate 10 and covering the metal contacts 101;

(c) providing a pressing head 30 having a suction pattern 301 arranged corresponding to the metal contacts 101;

(d) sucking conductive particles 401 by the pressing head 30; and (e) pressing the conductive particles 401 into the resin layer 20 by the pressing head 30.

Figure 2:
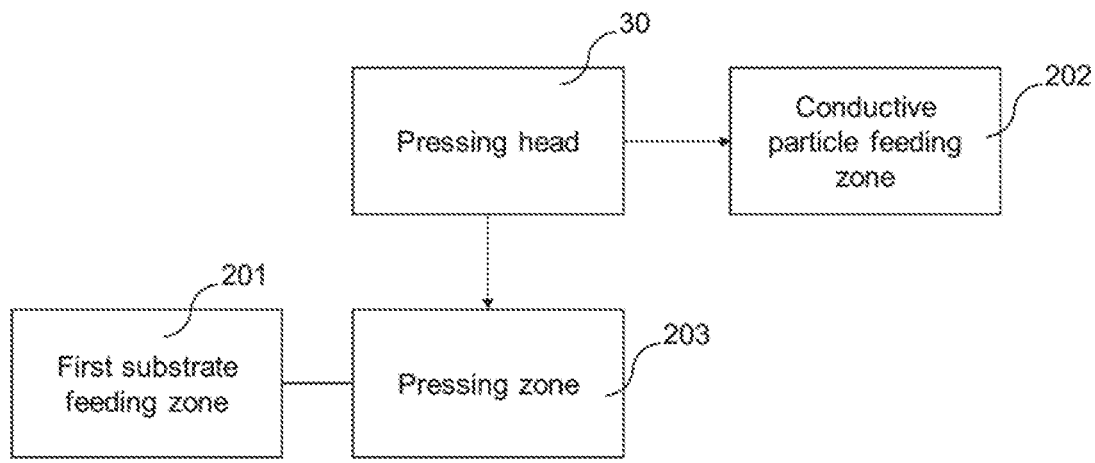
FIG. 2 is a block schematic view of an anisotropic conductive film manufacturing apparatus according to an embodiment of the present invention.

Referring to FIG. 2, an embodiment of the present invention provides an anisotropic conductive film manufacturing apparatus including: a first substrate feeding zone 201, a conductive particle feeding zone 202, a pressing zone 203 and a pressing head 30. The first substrate feeding zone 201 configured to provide a first substrate 10, the first substrate 10 has metal contacts 101, and the first substrate 10 further has a resin layer 20 disposed on the first substrate 10 and covering the metal contacts 101; the conductive particle feeding zone 202 is configured to provide conductive particles 401. The first substrate 10 is transferred from the first substrate feeding zone 201 to the pressing zone 203. The pressing head 30 has a suction pattern 301 arranged corresponding to the metal contacts 101, the pressing head 30 sucks the conductive particles 401 from the conductive particle feeding zone 202; and the pressing head 30 is then moved to the pressing zone 203 to press the conductive particles 401 into the resin layer 20.

The present invention will hereinafter be described the detailed construction, assembly relationship, and operation principle of the above-described respective elements of an embodiment of FIGS. 1A to 1H and FIG. 2 in detail. The first substrate 10 may be a printed circuit board having the metal contacts 101 disposed on a surface of the first substrate 10. The first substrate 10 may also be a flexible circuit board, a glass substrate or other components capable of providing electrical connections. The metal contacts 101 may be pads coated with a nickel-gold plating layer covered with a solder resist layer. The metal contacts 101 may connect traces disposed on the first substrate 10.

Please refer to FIG. 1A and FIG. 2, the step (a) provides the first substrate 10, the first substrate 10 having the metal contacts 101. In this step, the first substrates 10 may be placed in the first substrate feeding zone 201 and fed to the pressing zone 203 by a pick and place device. In this embodiment, the step (b) may be performed by a resin dispensing device (not shown) to disposing the resin layer 20 on the first substrate 10 and covering the metal contacts 101. The resin dispensing device is configured to dispense the resin layer 20 on the first substrate 10 by the resin dispensing device when the first substrate 10 is provided at the pressing zone 203. The anisotropic conductive film manufacturing apparatus may further include a pre-curing device configured to pre-cure the resin layer 20. After the resin layer 20 is dispensed on the first substrate 10, the resin layer 20 may be pre-cured via the pre-curing device (for example, to a B-stage of the resin). In another embodiment of the present invention, the resin layer 20 has been disposed on the first substrate 10 before the first substrate 10 is fed into the pressing zone 203.

Figure 1B:
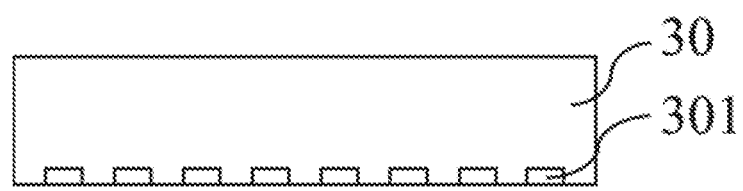

Referring to FIG. 1B and FIG. 2, the step (c) provides the pressing head 30, and the pressing head 30 has the suction pattern 301 arranged corresponding to the metal contacts 101. The pressing head 30 may be a magnetic pressing head having controllable magnetic coils, the controllable magnetic coils are arranged corresponding to the suction pattern 301; and the metal contacts 101 have a first pitch, and a second pitch of the controllable magnetic coils is the same as the first pitch of the metal contacts 101.

Figure 1C:
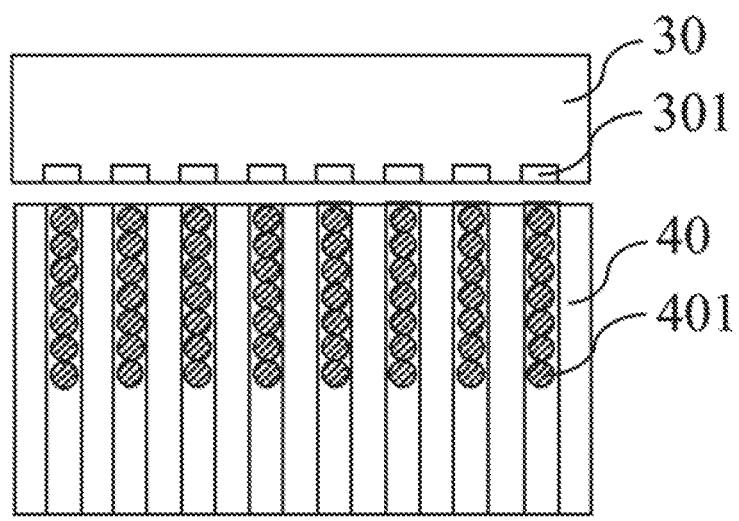

Referring to FIG. 1C and FIG. 2, the step (d) sucks the conductive particles 401 from the conductive particle feeding zone 202 by the pressing head 30. The conductive particles 401 are disposed in the conductive particle feeding device 40. The conductive particle feeding device 40 has grooves for accommodating the conductive particles 401. The grooves have a third pitch that is the same as the first pitch and the second pitch.

Figure 1D:
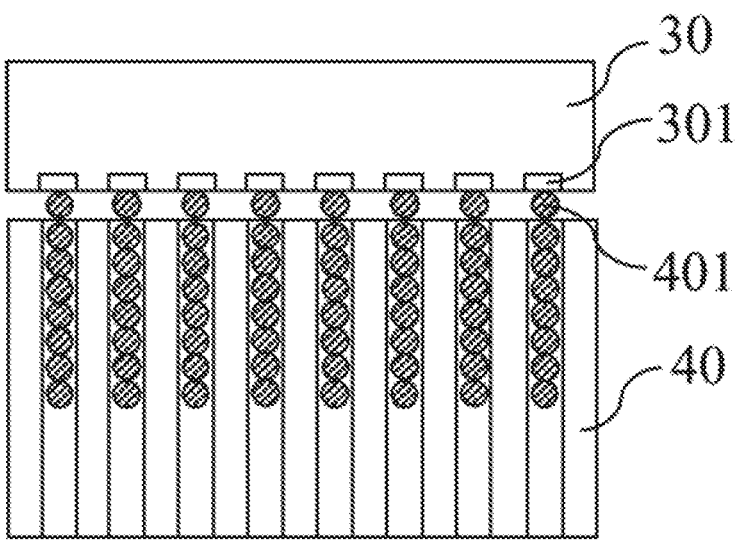

Referring to FIG. 1D and FIG. 2, after the suction pattern 301 of the pressing head 30 is aligned with the grooves at the conductive particle feeding device 40, the pressing head 30 sucks the conductive particles 401.

Figure 1E:
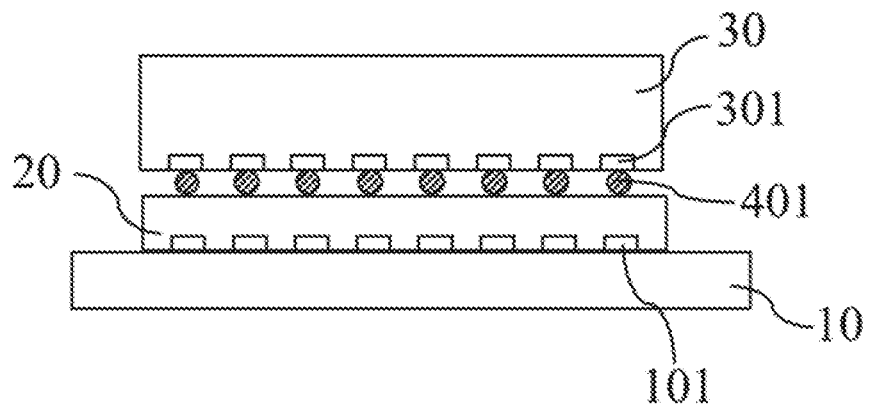

Referring to FIG. 1E and FIG. 2, after the conductive particles 401 are sucked by the pressing head 30, the pressing head 30 moves to the pressing zone 203. After the pressing head 30 is moved to the pressing zone 203, the pressing head 30 is aligned with the metal contacts 101 such that the conductive particles 401 are aligned with the metal contacts 101. Then, the resin layer 20 is heated by the pressing head 30 to melt the resin layer 20, In the present embodiment, the pressing head 30 has a heating device 303 configured to heat the resin layer 20 by the pressing head 30 to melt the resin layer 20. In the embodiment, the pressing head 30 is provided with an infrared heating device. When the pressing head 30 presses against the resin layer 20, the infrared heating device emits an infrared light to the resin layer 20, a temperature of the resin layer 20 is raised, so as to melt the resin layer 20. In the present embodiment, the heating device 303 only causes the upper half portion of the resin layer 20 to be a softened state, so that the conductive particles 401 can be embedded into the resin layer 20 without excessively softening the resin layer 20, thereby maintaining a sufficient standing height of the resin layer 20.

Figure 1F:
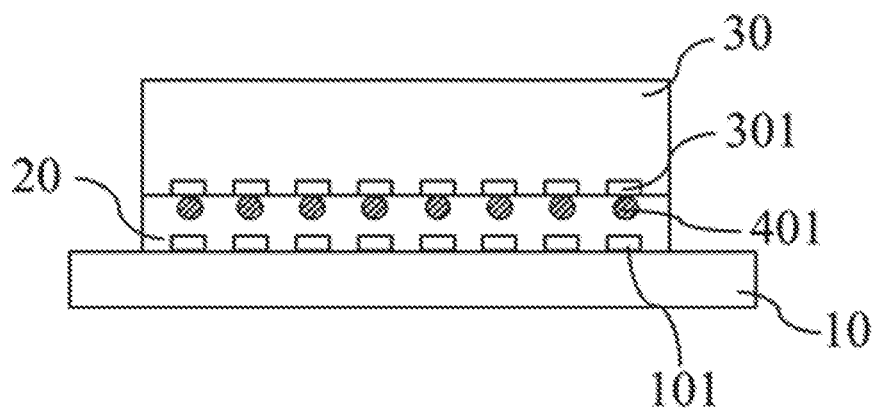

Referring to FIG. 1F and FIG. 2, the step (e) presses the conductive particles 401 into the resin layer 20 through the pressing head 30. After the heating device 303 is set to heat the pressing head 30 to a first temperature, and the first temperature is maintained for a period of time, the pressing head 30 is pressed down to press the conductive particles 401 into the resin layer 20, so that the conductive particles 401 are embedded into the resin layer 20 and corresponding to positions of the metal contacts 101. In this embodiment, a corresponding position is located above the metal contacts 101, but the conductive particles 401 are not in contact with the metal contacts 101.

Figure 1G:
Figure 1G:
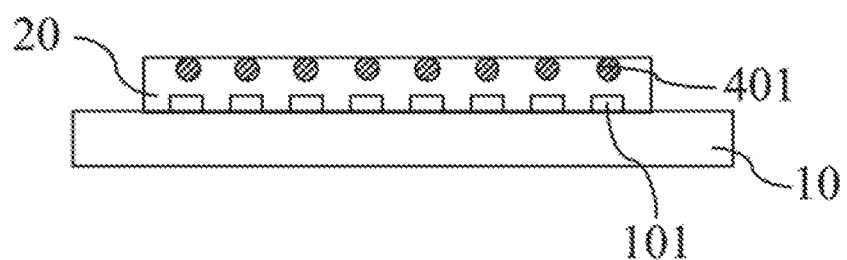

Referring to FIG. 1G and FIG. 2, after the conductive particles 401 are embedded in the resin layer 20, the pressing head 30 is cooled to cure the resin layer 20; and the pressure 30 is moved away from the resin layer 20. In the present embodiment, a second temperature is set to the pressing head 30, and the pressing head 30 is moved away from the resin layer 20 after the pressing head 30 is cooled to the second temperature.

Figure 1H:
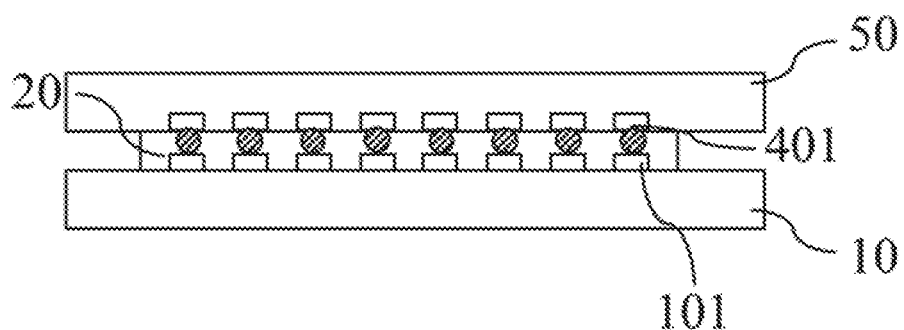

Referring to FIG. 1H and FIG. 2, a second substrate is provided on the resin layer 20, and a pressure is applied to the second substrate, thereby electrically connecting the second substrate to the metal contacts 101 of the first substrate 10 through the conductive particles 401. After the pressure is applied, the conductive particles 401 are in contact with the metal contacts 101 to form electrical conduction. Because the conductive particles 401 are embedded in the resin layer 20 while still maintaining a distance from the metal contacts 101 without being in contact with the metal contacts 101, when the pressure applies, the conductive particles 401 will not move to left and right, thereby reducing the occurrence chance of a short circuit.

Figure 3:
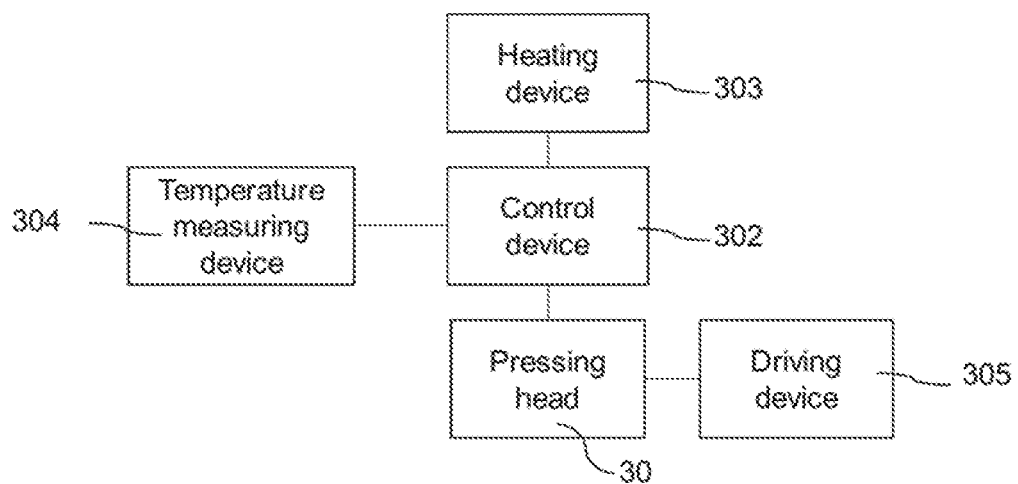
FIG. 3 is a block schematic view of a pressing head in an anisotropic conductive film manufacturing apparatus according to an embodiment of the present invention.

Referring to FIG. 3, a related configuration of an anisotropic conductive film manufacturing apparatus and a pressing head 30 further includes: a control device 302, a heating device 303, a temperature measuring device 304, and a driving device 305. The control device 302 is configured to connect to the heating device 303. The temperature measuring device 304 is configured to measure a temperature of the pressing head 30, such that when the heating device 303 heats the pressing head 30 to a first temperature, the heating of the heating device 303 is stopped via the control device 302. After the heating of the pressing head 30 is stopped and cooled to a second temperature measured by the temperature measuring device 304, the pressing head 30 is moved away from the resin layer 20. The pressing head 30 is coupled to the driving device 305, and the driving device 305 is configured to move the pressing head 30 to the conductive particle feeding region 202 to suck the conductive particles 401, and then the pressing head 30 moved to the pressing zone 203 after the conductive particles 401 is sucked. The anisotropic conductive film manufacturing apparatus further includes an alignment device (not shown) configured to align the pressing head 30 with the grooves at the conductive particle feeding device 40, and align the pressing head 30 with the metal contacts 101. After the above-mentioned movement is completed or if necessary, the driving unit 305 can also move the pressing head 30 to a standby zone located between the conductive particle feeding zone 202 and the pressing zone 203 (as shown at the position of the pressing head 30 of FIG. 2) to wait for the next operation.

As described above, compared with the problem existing in the conventional display panel that when an anisotropic conductive film is used, the conductive particles usually be moved during the bonding and pressing process, results that two adjacent contacts form a short circuit, so that the display panel occurs product failure or abnormality. The manufacturing method of the anisotropic conductive film and the apparatus thereof according to the present invention, the conductive particles are disposed corresponding to the metal contacts of the substrate, and when the conductive particles are embedded into the resin layer, there is still maintaining a distance from the metal contacts without being in contact with the metal contacts, such that after the pressure is applied, the conductive particles are not moved to left and right, thereby reducing the occurrence chance of a short circuit, so that the problem about the short circuit between contacts can be improved, and the product yield and reliability can also be improved.

The present invention has been described by the above related embodiments, but the above embodiments are merely examples for implementing the present invention. It must be noted that the disclosed embodiments do not intend to limit the scope of the invention. Conversely, modifications and equivalent arrangements are intended to be included within the scope of the invention

The invention claimed is:

1. A manufacturing method of an anisotropic conductive film, comprising steps of:
    (a) providing a first substrate having a plurality of metal contacts;
    (b) disposing a resin layer on the first substrate and covering the plurality of metal contacts;
    (c) providing a magnetic press head having a suction pattern arranged corresponding to the plurality of metal contacts, wherein the magnetic press head has a plurality of controllable magnetic coils arranged corresponding to the suction pattern;
    (d) attaching a plurality of conductive particles to the press head; and
    (e) aligning the press head with the plurality of metal contacts, and pressing the plurality of conductive particles into the resin layer by the press head.

2. The manufacturing method of the anisotropic conductive film according to claim 1, wherein a first pitch of the plurality of metal contacts is equal to a second pitch of the plurality of controllable magnetic coils.

3. The manufacturing method of the anisotropic conductive film according to claim 1, wherein the step (e) further comprises: heating the resin layer by the press head to melt the resin layer, thereby embedding the plurality of conductive particles into the resin layer and corresponding to positions of the plurality of metal contacts.

4. The manufacturing method of the anisotropic conductive film according to claim 3, wherein after the step of embedding the plurality of conductive particles into the resin layer, further comprising steps of: cooling the press head to cure the resin layer; and moving the press head away from the resin layer.

5. The manufacturing method of the anisotropic conductive film according to claim 1, wherein the manufacturing method of the anisotropic conductive film further comprises steps of: providing a second substrate on the resin layer, and applying a pressure to the second substrate, thereby electrically connecting the second substrate to the plurality of metal contacts of the first substrate through the plurality of conductive particles.

6. A manufacturing method of an anisotropic conductive film, comprising steps of:
    (a) providing a first substrate having a plurality of metal contacts;
    (b) disposing a resin layer on the first substrate and covering the plurality of metal contacts;
    (c) providing a press head having a suction pattern arranged corresponding to the plurality of metal contacts;
    (d) attaching a plurality of conductive particles to the press head; and
    (e) pressing the plurality of conductive particles into the resin layer by the press head.

7. The manufacturing method of the anisotropic conductive film according to claim 6, wherein the press head is a magnetic press head having a plurality of controllable magnetic coils, the plurality of controllable magnetic coils are arranged corresponding to the suction pattern, and a first pitch of the plurality of metal contacts is equal to a second pitch of the plurality of controllable magnetic coils.

8. The manufacturing method of the anisotropic conductive film according to claim 6, wherein the step (e) further comprises: aligning the press head with the plurality of metal contacts; and heating the resin layer by the press head to melt the resin layer, thereby embedding the plurality of conductive particles into the resin layer and corresponding to positions of the plurality of metal contacts.

9. The manufacturing method of the anisotropic conductive film according to claim 8, wherein after the step of embedding the plurality of conductive particles into the resin layer, further comprising steps of: cooling the press head to cure the resin layer; and moving the press head away from the resin layer.

10. The manufacturing method of the anisotropic conductive film according to claim 6, wherein the manufacturing method of the anisotropic conductive film further comprises steps of: providing a second substrate on the resin layer, and applying a pressure to the second substrate, thereby electrically connecting the second substrate to the plurality of metal contacts of the first substrate through the plurality of conductive particles.

* * * * *